United States Patent [19]

Saito et al.

[11] Patent Number: 4,802,106

[45] Date of Patent: Jan. 31, 1989

[54] SWEEP MARKER DISPLAY APPARATUS FOR POLAR COORDINATE DISPLAY

[75] Inventors: Goro Saito, Kanagawa; Hiroshi Itaya, Isehara, both of Japan

[73] Assignee: Anritsu Corporation, Tokyo, Japan

[21] Appl. No.: 852,413

[22] Filed: Apr. 16, 1986

[30] Foreign Application Priority Data

Apr. 22, 1985 [JP] Japan .............................. 60-58948[U]

[51] Int. Cl.[4] .......................... G01R 13/30; H03J 7/00

[52] U.S. Cl. .................................... 364/521; 340/722; 364/481; 324/77 CS; 315/377

[58] Field of Search ............... 364/481, 480, 484, 485, 364/521, 518; 340/721, 722; 324/77 C, 77 CS, 77 B; 315/377, 378

[56] References Cited

U.S. PATENT DOCUMENTS

| | | | |
|---|---|---|---|
| 2,084,760 | 6/1937 | Beverage | 324/77 C |
| 3,060,427 | 10/1962 | Jaffe et al. | 315/378 |
| 3,593,184 | 7/1971 | Herrero | 324/77 B |
| 3,599,033 | 8/1971 | Stettiner | 340/721 |
| 3,641,515 | 2/1972 | Sues | 364/485 |
| 3,643,126 | 2/1972 | Hay | 324/77 C |
| 3,811,840 | 5/1974 | Weinfurt et al. | 364/518 |
| 4,078,252 | 3/1978 | Shoenfeld et al. | 364/518 |
| 4,249,171 | 2/1981 | Batcher | 364/521 |
| 4,325,023 | 4/1982 | Zirwick | 324/77 C |
| 4,346,378 | 8/1982 | Shanks | 340/754 |
| 4,533,866 | 8/1985 | Zirwick | 324/77 B |
| 4,601,021 | 7/1986 | Paul et al. | 364/521 |
| 4,603,396 | 7/1986 | Washizuka et al. | 364/518 |
| 4,613,814 | 9/1986 | Penney | 324/77 B |
| 4,660,150 | 4/1987 | Anderson et al. | 364/485 |
| 4,703,433 | 10/1987 | Sharrit | 324/77 B |

OTHER PUBLICATIONS

Hewlett Packard Journal, Aug. 1968, vol. 19, No. 12, pp. 2-20 (all); articles by Unter, Grisell et al. and Hearn et al.

Richard Wysome, article "Spectrum Analyser Frequency Range Extended to 1250 MHz", Marconi Instrumentation, vol. 17, No. 2, pp. 40-44, May 1980.

*Primary Examiner*—Parshotam S. Lall
*Assistant Examiner*—S. A. Melnick
*Attorney, Agent, or Firm*—Frishauf, Holtz, Goodman & Woodward

[57] ABSTRACT

A signal analyzing means performs frequency sweep for input signals to be measured, and outputs vector data corresponding to sampling frequencies. The analyzing means supplies pulses to a sweep marker generating means at timings for causing the signal analyzing means to supply the vector data corresponding to the sampling frequencies to the display means. Whenever the sweep marker generating means receives a pulse from the signal analyzing means, it outputs address data for extending a sweep marker. The display means includes a CRT and displays a designated polar coordinate image on the CRT screen. The display means translates the vector data to address data of a position suitable for the polar coordinate image. The address data and sweep marker address data are superposed on polar coordinate data displayed on the CRT screen. The vector data and the sweep marker are simultaneously displayed on the CRT screen.

12 Claims, 4 Drawing Sheets

SWEEP MARKER DISPLAY APPARATUS FOR POLAR COORDINATE DISPLAY

BACKGROUND OF THE INVENTION

This invention relates to a signal analyzer for displaying, as polar coordinates, an analysis result of a signal to be measured and, more particularly, to a signal analyzer having a sweep marker display, for displaying a sweep marker indicating a sweep position in synchronism with the polar coordinate display as a result of analysis of the measured signal.

Some conventional signal analyzers (e.g., network and impedance analyzers) for analyzing an input signal with a frequency sweep signal output an analysis data display of the input signal analysis result as polar coordinates. When polar coordinate display is performed, continuous display between sweep start and end frequencies is often represented by spiral or dot.

In such a display state, a current position of trace data cannot be known during a sweep, nor can the sweep repetition frequency of the trace data be detected. If the trace data is represented by a point, no conventional analyzers can determine whether the sweep continues or is completed.

SUMMARY OF THE INVENTION

The present invention is contrived in consideration of these circumstances, and is intended to provide a signal analyzer with a sweep marker display, for displaying a sweep marker representing a sweep position in synchronism with a polar coordinate display of the result of analysis of a signal to be measured.

According to the present invention, there is provided a signal analyzer comprising: input means for inputting measuring conditions; signal analyzing means for frequency-sweeping the signal according to the measuring conditions input at the input means, and outputting vector data representing an analysis result of the signal; display means for displaying, as polar coordinates, the vector data output from the signal analyzing means; and sweep marker generating means for generating a sweep marker corresponding to a measuring frequency for frequency sweep, wherein the sweep marker representing a sweep condition is displayed in synchronism with the polar coordinate display of the data.

DETAILED DESCRIPTION OF THE PREFERRED EMBODIMENT

Figure 1:
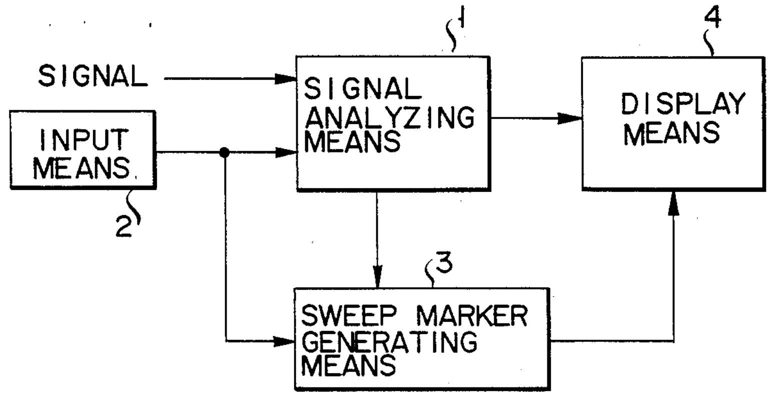
FIG. 1 is a block diagram showing a basic arrangement of a signal analyzer with a sweep marker display according to the present invention.

In order to best understand the present invention, its principle will be described with reference to FIG. 1 before the preferred embodiment is described. Referring to FIG. 1, reference numeral 1 denotes a signal analyzing means, such as a network analyzer for analyzing signals in a network. Means 1 performs a frequency sweep for an input signal to be measured, and outputs vector data corresponding to a measuring (or sampling) frequency. Sweep start and end frequencies are determined according to inputs at input means 2. Measuring condition signals such as a sweep start signal, an entire sweep signal, and a partial sweep signal are supplied from means 2 to means 1.

Means 1 outputs pulses to sweep marker generating means 3. Pulse output timings cause means 1 to supply vector data of a given sampling frequency to display means 4. Means 3 generates address data to update the sweep marker (to be described later) whenever it receives the pulse from means 1.

Means 4 has a cathode-ray tube (CRT) and displays a coordinate image designated by means 2 on the CRT screen. Means 4 translates vector data from means 1 to address data corresponding to the coordinate image. This address data and sweep marker address data from means 3 are superposed on the coordinate image displayed on the CRT screen. Therefore, the vector data and the sweep marker are simultaneously displayed on the CRT screen.

Figure 2A:
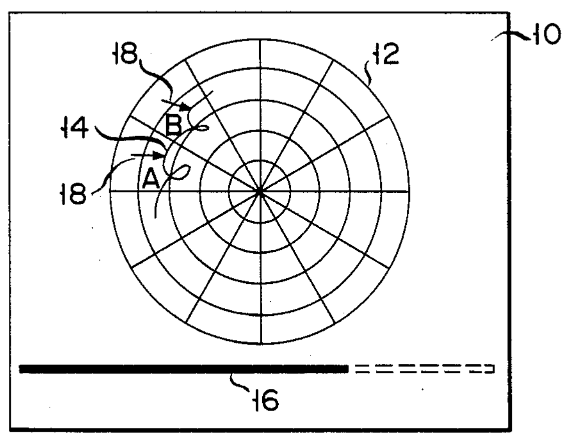
FIGS. 2A to 2C are plan views showing sweep markers displayed in synchronism with a polar coordinate display.

A preferred embodiment of the present invention will be described with reference to the accompanying drawings. FIG. 2A shows a display state of CRT screen 10 when an entire sweep is performed. Polar chart 12 as the coordinate image is displayed on screen 10, and polar coordinate display 14 as the result of analysis of an input signal is plotted on the screen 10. Rod-like sweep marker 16 representing a current sampling frequency is also displayed on screen 10. Marker 16 extends from the left to the right on screen 10, in synchronism with plotting of display 14 of the input signal to be measured. Even if display 14 on chart 12 does not move and is fixed at a point, a sweep can be detected due to extension (movement) of marker 16 to the right.

Figure 2B:
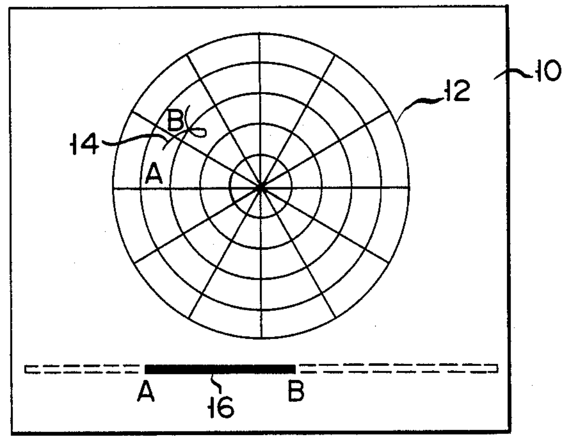

FIG. 2B shows a display state of a partial sweep. Chart 12 is displayed on screen 10. Display 14 of an input signal on chart 12 is performed, and sweep marker 16 representing a current sampling frequency is displayed. In this case, marker 16 is displayed for a preset sweep interval. More specifically, a partial sweep is performed for a given sweep interval (e.g., an interval between points A and B) of display 14 in FIG. 2A. An operator inputs partial sweep markers 18 for points A and B at the input means to determine the partial sweep interval. In a partial sweep, as shown in FIG. 2B, polar coordinate display 14 of the measured signal between points A and B and marker 16, representing that a sweep has been completed for the partial sweep interval, are displayed on screen 10.

Figure 2C:
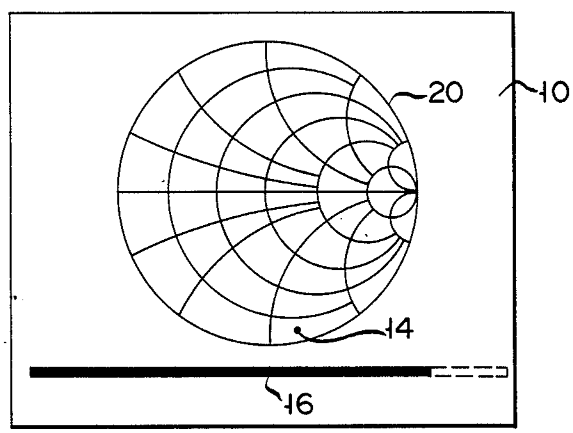

FIG. 2C shows impedance chart 20 of a Smith chart when an entire sweep is performed. Polar coordinate 14 of an input signal on chart 20, and sweep marker 16 representing a current sampling frequency are displayed on screen 10. In this case, display 14 of the signal on chart 20 is a single point. However, marker 16 extends to the right whenever the point is displayed. Therefore, the operator can visually recognize whether a sweep is being performed or not.

Figure 3:
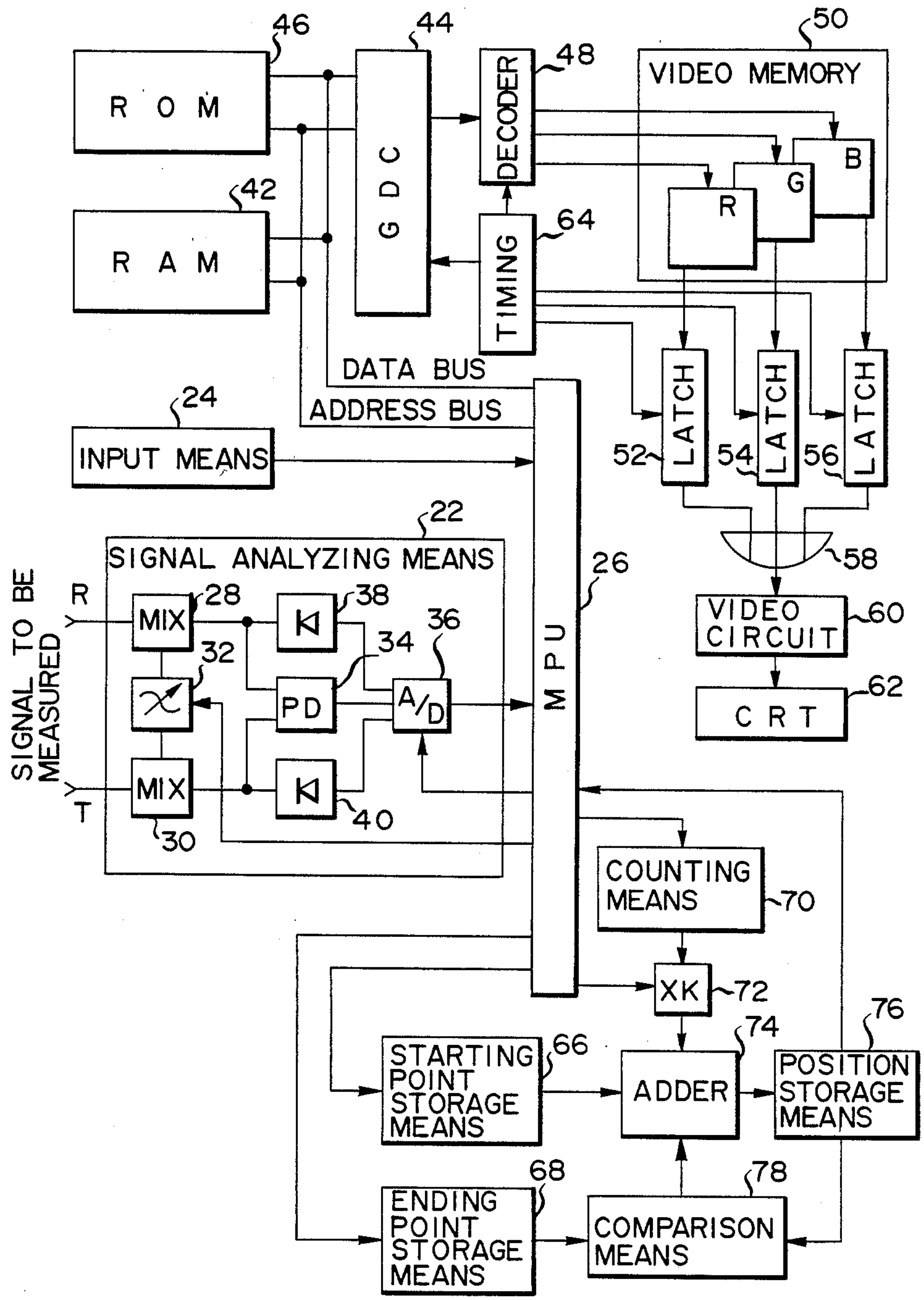
FIG. 3 is a block diagram of a signal analyzer with a sweep marker display according to an emodiment of the present invention.

FIG. 3 is a block diagram of an analyzer with a sweep marker display according to an embodiment of the present invention. Means 22 is a signal analyzing means, such as a network analyzer, which performs frequency sweeping for a frequency range preset at input means 24. Sweep frequency control is performed by microprocessor (MPU) 26. Means 22 outputs data represented by polar coordinates for amplitude and phase, both of which correspond to a given sampling frequency.

Reference and test signals R and T, as signals to be measured, are supplied to means 22. Each of these signals is mixed with a signal from common local oscillator 32 by each of mixers 28 and 30, and are converted to intermediate frequency signals (IF). These IF signals are supplied to phase detector (PD) 34. Detector 34 compares the phases of signals R and T and extracts an analog signal corresponding to a difference between the phases thereof. The phase difference signal is supplied to analog/digital (A/D) converter 36. The amplitudes of the IF signals are detected by amplitude detectors 38 and 40, respectively. The detected amplitude signals are supplied to converter 36 and converted to digital signals. The digital signals as amplitude and phase data are supplied to MPU 26. In this case, the oscillation frequency of oscillator 32 and the conversion timings of converter 36 are controlled by MPU 26.

MPU 26 receives the amplitude data from converter 36 and converts a log value to a linear value. With the phase data, the conversion result is data represented by polar coordinates of amplitude and phase, both of which correspond to coordinates designated by means 24. MPU 26 calculates addresses of a dot for data represented by the polar coordinates on the polar chart, according to $r.\cos\theta$, $r.\sin\theta$, and the origin of the polar chart. X- and y-coordinates are then derived on the basis of amplitude r and phase $\theta$. The address data is stored in random accress memory (RAM) 42 and at the same time, supplied to graphic display controller (GDC) 44. GDC 44 also receives sweep marker address data) to be described later).

Chart 12 of FIGS. 2A and 2B, and chart 20 shown in FIG. 2C are prestored as coordinate image data in read-only memory (ROM) 46. A description will be made upon designation of chart 12 shown in FIG. 2A. MPU 26 accesses ROM 46 in accordance with designation of the coordinate image data, and predetermined polar chart coordinate image data is read out from ROM 46. The readout data is supplied to GDC 44.

The data supplied to GDC 44 is superposed on polar coordinate data representing an amplitude and a phase whenever means 22 outputs such data. More specifically, address data of a dot represented by the polar coordinate data supplied to GDC 44, the sweep marker address data, and coordinate image data are supplied to video memory 50 through decoder 48, and are stored in the R, G, and B memories therein. The image data is composited by OR gate 58 through latch circuits 52, 54, and 56. The composited data from gate 58 is supplied to CRT 62 through video circuit 60. Chart 12 in FIG. 2A is displayed on screen 10 of CRT 62. Timing signals for GDC 44, decoder 48, and latch circuits 52, 54, and 56 are generated by timing generating circuit 64.

MPU 26 also determines sampling frequencies $f_0$, $f_1$, . . . $F_{1023}$ from the number of horizontal pixels (e.g., 1024) of CRT 62 on the basis of the sweep start and end frequencies or the sweep frequency range which is supplied from input means 24. The respective measurements are performed at corresponding sweep frequencies $f_i$. In other words, oscillator 32 is controlled such that the frequency of IF signals as outputs from mixers 28 and 30 are set to be frequency $f_i$. Therefore, means 22 outputs polar coordinate data ($r_i$, $\theta_i$) representing the amplitude and phase as a result of measurement with frequency $f_i$.

Whenever polar coordinate data of the amplitude and phase is output from means 22, the above-mentioned superposition is performed. As a result, display 14 of the input signal is written at a corresponding position on chart 12, as shown in FIG. 2A.

Rod-like sweep marker 16 is generated in the following manner. When an entire sweep is designated at means 24, MPU 26 sets "0" in starting point storage means 66 and "1023" in ending point storage means 68. Value "1023" is calculated by subtracting one from "1024", the number of horizontal pixels of CRT 62. Whenever polar coordinate data representing the amplitude and phase is supplied from means 22 to MPU 26, MPU 26 supplies one pulse to counting means 70. A count output from means 70 is multiplied by k by k multiplier 72. An output from multiplier 72 is supplied to adder 74. The multiplication coefficient k is set by MPU 26 according to the number of sweep marker dots along the X-axis (i.e., "1024" or the number of horizontal pixels of CRT 62) and the total number of measuring points (i.e., the total number of sampling frequencies).

The k-multiplied value is added by adder 74 to the content "0" preset in means 66. A sum from adder 74 is stored in position storage means 76. The number represented by the sum stored in means 76 corresponds to the horizontal address of marker 16 shown in FIG. 2A. The value stored in means 76 is supplied to GDC 44 through MPU 26 and is superposed on the polar coordinate data as the polar chart and the address data for a dot position of polar coordinate data representing the amplitude and phase. Whenever the polar coordinate data representing the amplitude and phase is supplied from means 22 to MPU 26, MPU 26 supplies one pulse to means 70. Marker 16 extends to the right by one step every time each point of display 14 of the signal is plotted on chart 12. Therefore, marker 16 is displayed in synchronism with display 14 of the measured signal.

The value stored in means 76 is compared with the value stored in means 68 by comparison means 78. When two input values coincide with each other, means 78 supplies an addition inhibit signal to adder 74. When means 22 supplies polar coordinate data of the amplitude and phase of the signal measured at frequency $f_{1023}$ as the 1024th frequency to MPU 26, means 76 stores the corresponding value, "1023". This value coincides with value "1023" stored in means 68, and therefore, means 78 supplies an addition inhibit signal to adder 74. Marker 16 thus reaches the right end position where all sweep frequencies set at means 24 have been completed in synchronism with display 14 of the corresponding signal.

Figure 4:
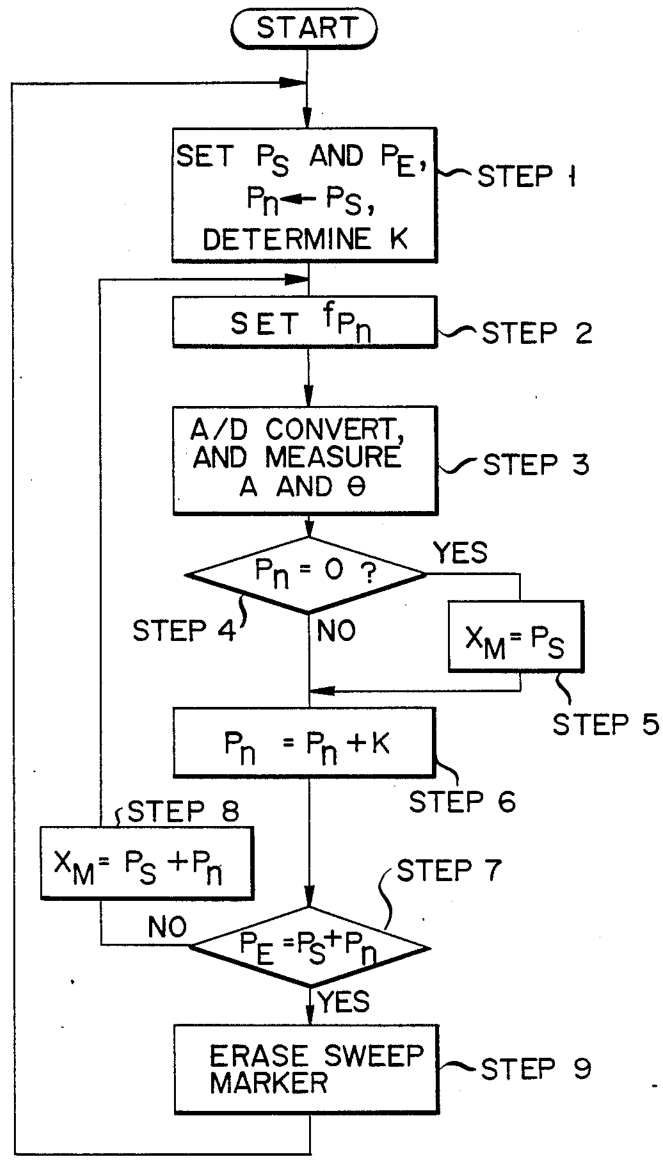
FIG. 4 is a flow chart for explaining the operation of the signal analyzer of FIG. 3.

Components 66 to 78 for generating the sweep marker are functionally represented in terms of software executed by MPU 26. The actual sequence follows a flow chart in FIG. 4. More specifically, sweep start and end points $P_S$ and $P_E$ are set at means 24. At the same time, start point $P_S$ is set at point $P_n$ and value k is determined (step 1). In the above description, "0" and "1023" are respectively set as points $P_S$ and $P_E$. Value k is calculated as follows:

k=(number of sweep marker dots along X-axis)/(total number of measuring points) Subsequently, measuring frequency $f_{Pn}$ is set (step 2). In practice, the oscillation frequency of oscillator 32 is controlled such that the intermediate frequency of means 22 is set to be measuring frequency $f_{Pn}$. The phase and amplitude of the IF signals are detected and converted by A/D converter 36, thereby measuring amplitude A and phase $\theta$ (step 3). MPU 26 calculates polar chart addresses from amplitude A and phase $\theta$. Amplitude A is log/linear converted, and polar chart addresses (X, Y) are calculated:

$$X=r\cdot\cos\theta$$

$$Y=r\cdot\sin\theta$$

where r is the amplitude after log/linear conversion.

If point $P_n$ is "0" (step 4), the value of point $P_S$ is set to be X-coordinate address $X_M$ of marker 16 on screen 10 of CRT 62 (step 5), and a dot is displayed at the display start point of marker 16. However, if $P_n$ is not "0" (step 4), value k is added to the value of point $P_n$, and the resultant sum is set to be $P_n$ (step 6).

Point $P_n$ is then added to the value of point $P_S$, and the sum is compared with "1023" of point $P_E$ (step 7). If the sum is not equal to "1023", the result obtained by adding $P_n$ to the value of point $P_S$ is set to be X-coordinate address $X_M$ of marker 16 (step 8). In other words, marker 16 is extended to the right by k dots. The flow then returns to step 2, and marker 16 extends to the right according to the frequency sweep. If MPU 26 determines in step 7 that the sum of $P_n$ and the value of point $P_S$ coincides with the value (i.e., "1023") of point $P_E$, the sweep is completed and marker 16 is erased (step 9). In practice, marker 16 is generated by software.

Referring to FIG. 2A, in order to perform a partial sweep between points A and B of display 14 of the signal displayed on chart 12, the following operation is performed. Marker 18 is set for the interval between points A and B by means 24, and a partial sweep is designated. MPU 26 calculates sweep frequencies $f_A$ and $f_B$ (for $f_A<f_B$) at positions of points A and B in step 1. CRT 62 horizontal addresses $N_A$ and $N_B$ corresponding to frequencies $f_A$ and $f_B$ are set at points $P_S$ and $P_E$, respectively. The subsequent operation follows the flow chart as described above.

The above description exemplifies the case wherein coordinate image data of the polar chart is designated. However, as shown in FIG. 2C, even if coordinate image data of the standard impedance chart of a Smith chart is designated, marker 16 can be similarly displayed.

Marker 16 is not limited to the rod-like marker shown in FIGS. 2A to 2C. For example, a triangular mark, an arrow, or any shape may extend to the right in accordance with the frequency sweep to allow the operator to visually check a change in the marker. Alternatively, sweep marker 16 can be replaced with one which forms a circle instead of extending linearly.

According to the present invention as described above, a sweep position display marker can be displayed in synchronism with a polar coordinate display of a signal to be measured. An operator can visually recognize that the signal sweep is being peformed, completed, or interrupted, even if the polar coordinate display involves only one point. In particular, if polar coordinates are plotted to form a circle and identical circles are plotted a plurality of times, the sweep repetition frequency can be visually recognized. Therefore, during a low-speed sweep, the current display position can be distinct.

What is claimed is:

1. A signal analyzer apparatus for displaying analysis results on a polar coordinate system, comprising:

signal measuring means for measuring input signals to be measured, at measuring frequencies between measurement start and end frequencies, and for sequentially determining and outputting measurement vector data which includes a magnitude component and an angle component in polar coordinates, at each of said measuring frequencies;

display means for receiving said measurement vector data output from said signal measuring means, and for sequentially displaying the measurement vector data on a polar coordinate system each time said display means receives said measurement vector data; and sweep marker display means for displaying on said display means a sweep marker whose shape changes as the signal measuring means sequences between said measurement start and end frequencies, said sweep marker representing, by its shape, the current measuring frequency used by the signal measuring means to determine the measurement vector data displayed on said display means.

2. The apparatus of claim 1, wherein said display means includes a CRT screen for displaying said measurement vector data on said polar coordinate system, and for also displaying said sweep marker in the vicinity of the polar coordinate system;

means for determining a number of measurement frequencies between said measurement start and end frequencies to be in proportion to a number of horizontal pixels of said CRT screen; and said CRT having horizontal address data, said sweep marker being a rod-like marker which sequentially extends in a horizontal direction on said CRT screen each time said signal measuring means sequences to another of said measuring frequencies and outputs measurement vector data in response thereto.

3. The apparatus of claim 2, wherein said sweep marker display means comprises:

start frequency storing means for storing a value corresponding to said measurement start frequency;

end frequency storing means for storing a value corresponding to said measurement end frequency;

counting means for counting a number of times by which said signal measuring means outputs said measurement vector data;

adding means for adding a value stored in said start frequency storing means and the number of times counted by said counting means;

address supply means for supplying an added result of said adding means to said display means as said horizontal address data of said CRT; and comparing means for comparing the added result of said adding means and the value stored in said end frequency storing means, and, when they are in accord, for stopping operation of said adding means.

4. The apparatus of claim 3, wherein said sweep marker display means causes said CRT screen to show said rod-like sweep marker up to the address indicated by the address data fed from said address supply means, whereby said rod-like sweep marker sequentially extends horizontally on said CRT screen from the left to the right, each time the signal measuring means sequences to a new current measuring frequency for determining said measurement vector data which are sequentially displayed on said CRT screen.

5. The apparatus of claim 3, wherein said sweep marker display means further comprises a constant multiplier for multiplying a constant k by the number of times counted by said counting means, in accordance with a number of measuring frequencies through which the signal measuring means has sequenced, and providing the k-multiplied output to said adding means, wherein k is calculated by:

k=(the number of horizontal pixels of said CRT screen)/(total number of measuring frequencies).

6. The apparatus of claim 5, wherein said sweep marker display means causes said CRT screen to show said rod-like sweep marker up to the address indicated by the address data fed from said address supply means, whereby said rod-like sweep marker sequentially extends horizontally from one length on said CRT screen to the next length from the left to the right, each time the signal measuring means sequences to a new current measuring frequency for determining said measurement vector data which are sequentially displayed on said CRT screen.

7. A signal analyzer apparatus for displaying analysis results on a polar coordinate system, comprising:

display means for sequentially receiving measurement vector data which includes sets of a magnitude component and an angle component, which sets are obtained, respectively, by measuring input signals to be measured at each measuring frequency between measurement start and end frequencies, and for sequentially displaying respective sets of the measurement vector data in a polar coordinate system each time the display means receives a respective set of the measurement vector data; and sweep marker display means for displaying on said display means a sweep marker whose shape changes with sequencing of the measuring frequencies between said measurement start and end frequencies, said sweep marker representing, by its shape, the current measuring frequency of the measurement vector data displayed on said display means.

8. The apparatus of claim 7, wherein said display means includes a CRT screen for displaying said measurement vector data on said polar coordinate system, and for also displaying said sweep marker in the vicinity of the polar coordinate system;

means for determining a number of measurement frequencies between said measurement start and end frequencies to be in proportion to a number of horizontal pixels of said CRT screen; and said CRT having horizontal address data, said sweep marker being a rod-like marker which sequentially extends in a horizontal direction on said CRT screen each time said signal measuring means sequences to another of said measuring frequencies and outputs measurement vector data in response thereto.

9. The apparatus of claim 8, wherein said sweep marker display means comprises:

start frequency storing means for storing a value corresponding to said measurement start frequency;

end frequency storing means for storing a value corresponding to said measurement end frequency;

counting means for counting a number of times by which said signal measuring means outputs said measurement vector data;

adding means for adding a value stored in said start frequency storing means and the number of times counted by said counting means;

address supply means for supplying an added result of said adding means to said display means as said horizontal address data of said CRT; and comparing means for comparing the added result of said adding means and the value stored in said end frequency storing means, and, when they are in accord, for stopping operation of said adding means.

10. The apparatus of claim 9, wherein said sweep marker display means causes said CRT screen to show said rod-like sweep marker up to the address indicated by the address data fed from said address supply means, whereby said rod-like sweep marker sequentially extends horizontally from one length on said CRT screen to the next length from the left to the right, each time the signal measuring means sequences to a new current measuring frequency for determining said measurement vector data which are sequentially displayed on said CRT screen.

11. The apparatus of claim 9, wherein said sweep marker display means further comprises a constant multiplier for mulitplying a constant k by the number of times counted by said counting means, in accordance with a number of measuring frequencies through which the signal measuring means has sequenced, and providing the k multiplied output to said adding means, wherein k is calculated by:

k=(the number of horizontal pixels of said CRT screen)/(total number of measuring frequencies).

12. The apparatus of claim 11, wherein said sweep marker display means causes said CRT screen to show said rod-like sweep marker up to the address indicated by the address data fred from said address supply means, whereby said rod-like sweep marker sequentially extends horizontally from one length on said CRT screen to the next length from the left to the right, each time the signal measuring means sequences to a new current measuring frequency for determining said measurement vector data which are sequentially displayed on said CRT screen.

* * * * *